(12) United States Patent
Colbert et al.

(10) Patent No.: US 6,634,095 B2
(45) Date of Patent: Oct. 21, 2003

(54) APPARATUS FOR MOUNTING A LAND GRID ARRAY MODULE

(75) Inventors: John L. Colbert, Byron, MN (US);
John S. Corbin, Jr., Austin, TX (US);
Roger D. Hamilton, Eyota, MN (US);
Danny E. Massey, Austin, TX (US);
Arvind K. Sinha, Rochester, MN (US);
Charles C. Stratton, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 09/892,967

(22) Filed: Jun. 27, 2001

(65) Prior Publication Data

US 2003/0000080 A1 Jan. 2, 2003

(51) Int. Cl.[7] ................................................. B23P 19/00
(52) U.S. Cl. .............................. 29/740; 29/760; 29/832; 257/726; 257/727; 269/199; 269/229; 269/903
(58) Field of Search ........................... 29/739, 740, 741, 29/743, 759, 760, 832, 840; 269/196, 199, 289 R, 229, 231, 900, 903; 361/760, 767, 768, 783, 810, 829; 257/726, 727; 439/351, 361, 71, 264, 330, 362, 526

(56) References Cited

U.S. PATENT DOCUMENTS

| | | | | | |
|---|---|---|---|---|---|
| 4,376,560 A | * | 3/1983 | Olsson et al. | ................ | 361/809 |
| 5,000,697 A | * | 3/1991 | Murphy | ..................... | 439/331 |
| 5,691,041 A | | 11/1997 | Frankeny et al. | ........... | 428/209 |
| 5,738,531 A | | 4/1998 | Beaman et al. | ................ | 439/71 |

* cited by examiner

Primary Examiner—Peter Vo
Assistant Examiner—Donghai Nguyen
(74) Attorney, Agent, or Firm—Cardinal Law Group; Casimer K. Salys

(57) ABSTRACT

An installation apparatus of installing a land grid array (LGA) multi-chip module assembly to a printed wiring board is provided. A module holding member is attached to the printed wiring board. The module assembly is inserted into the module holding member. The module assembly is retained to the module holding member, which facilitates mechanical actuation of the LGA compression hardware. The module assembly is electrically grounded to the printed wiring board while the module assembly is retained to the module holding member.

13 Claims, 2 Drawing Sheets

APPARATUS FOR MOUNTING A LAND GRID ARRAY MODULE

TECHNICAL FIELD OF THE INVENTION

In general, the invention relates to land grid arrays (LGA), and more specifically, the invention relates to installation of LGA multi-chip modules.

BACKGROUND OF THE INVENTION

Area array socket connectors are an evolving technology in which an electrical interconnection between mating surfaces is provided through a conductive interposer. One significant application of this technology is the socketing of land grid array (LGA) modules directly to a printed wiring board in which the electrical connection is achieved by aligning the contact array of the two mating surfaces and the interposer then mechanically compressing the interposer. LGA socket assemblies are prevalent today in the electronics industry, but they are typically used to attach single-chip-modules to printed wiring boards. The demand for higher performance is driving the requirement to develop LGA socket assemblies for multi-chip modules.

One of the problems confronting the design of multi-chip module socket assemblies is developing a mechanical system to generate the large force required to compress the increased contact area of the interposer without interfering with the heat transfer system of the module, distorting the printed wiring board, or occupying a significant portion of the volume of the enclosure in which the module is housed. A system has been devised to solve this problem utilizing one or more load posts attached to the module. The load posts pass though the printed wiring board and a mechanical system incorporating a stiffening plate to reduce printed wiring board distortion is then employed to exert a large tensile force on the load posts pulling the module toward the printed wiring board and compressing the interposer. Since the mechanical system used to compress the interposer is on the side of the printed wiring board opposite the module, it may not occupy any volume of the enclosure nor interfere with heat transfer. One drawback of this system is that if the printed wiring board is mounted vertically, it is very difficult for one person to actuate the connection system on the opposite side of the printed wiring board while holding the multi-chip module in place.

The surface of the module that contacts the printed wiring board has a plurality of electrical connection points attached to circuits within the module. The electrical connection points on the module need to be aligned with corresponding electrical connection points on the printed wiring board to yield the desired operation of the circuits. If the module is symmetrical, it may be inserted into the socket in more than one orientation. Insertion of the module into the socket in an orientation other than that intended may result in the electrical connection points not being properly aligned. A keying mechanism may be employed to change the geometry of the module and socket to an asymmetrical shape so that the module can only be inserted into the socket in one orientation.

The demand for higher performance is also driving the density of components mounted to the printed wiring board to increase, reducing the visibility of the technician to guide the module into the socket. Contacting the module to surrounding electrical components may damage the module, the LGA interposer, or the contacted component. The addition of guiding members on the socket may aid the technician in inserting the module into the socket reducing the risk of potential damage.

The module may include electrical circuits employing low break down voltage, high impedance, semiconductor devices. If an electro-static charge is allowed to accumulate near a semiconductor, the charge may increase to a level sufficient enough to ionize a path to ground through the semiconductor. The discharge of an electro-static charge through a semiconductor may break down the semiconducting material effecting the circuit operation. Airborne dust particles blown by a fan, used to cool a heat sink attached to the module, may rub against the heat sink and other components in the air flow causing static charges to accumulate. Using electrically conductive material for the heat sink and components in the airflow and electrically connecting them to ground may aid in dissipating electro-static charges.

What is therefore needed is a method and holding member that will guide and orientate an multi-chip module into a socket, temporarily retain the module freeing the technician to move to the opposite side of the printed wiring board and actuate the mechanical connection system, and provide a ground path to dissipate any static charge accumulated on the heat sink attached to the module.

SUMMARY OF THE INVENTION

One aspect of the invention provides a method of installing a land grid array (LGA) multi-chip module to a printed wiring board. A module holding member is attached to the printed wiring board. A module assembly is inserted into the module holding member. The module assembly is retained to the module holding member. The module assembly is electrically connected to the printed wiring board while the module is retained to the module holding member. The holding member may apply a force to an outer surface of the module assembly. A cam may be rotated to apply a force to an outer surface of the module assembly. A socket site in the module holding member may position the module assembly. The module holding member may guide the module assembly. The module assembly may be keyed into the module holding member.

Another aspect of the invention provides an installation apparatus for a land grid array (LGA) multi-chip module utilizing a frame member surrounding an LGA socket site. At least one retaining member operably attached to the frame, wherein the frame is attached to a printed wiring board and a LGA multi-chip module assembly is installed onto an LGA socket site and retained to the module holding member with the retaining member. The frame member may comprise conductive plastic. The frame member may include a chamfered corner to orientate the module assembly. A retaining member may be comprised of a cam. Cam receptors may receive cam members. Cam members may be attached to the cam receptors. The cam member may include a hexagonal column. The cam member may include an inclined plane. The inclined plane may include a stop. The frame may include a guide portion. The frame member may include mounting pads. The wall of the frame may include a stiffening rib.

The foregoing and other features and advantages of the invention will become further apparent from the following detailed description of the presently preferred embodiments, read in conjunction with the accompanying drawing.

DETAILED DESCRIPTION OF THE PRESENTLY PREFERRED EMBODIMENTS

Figure 1:
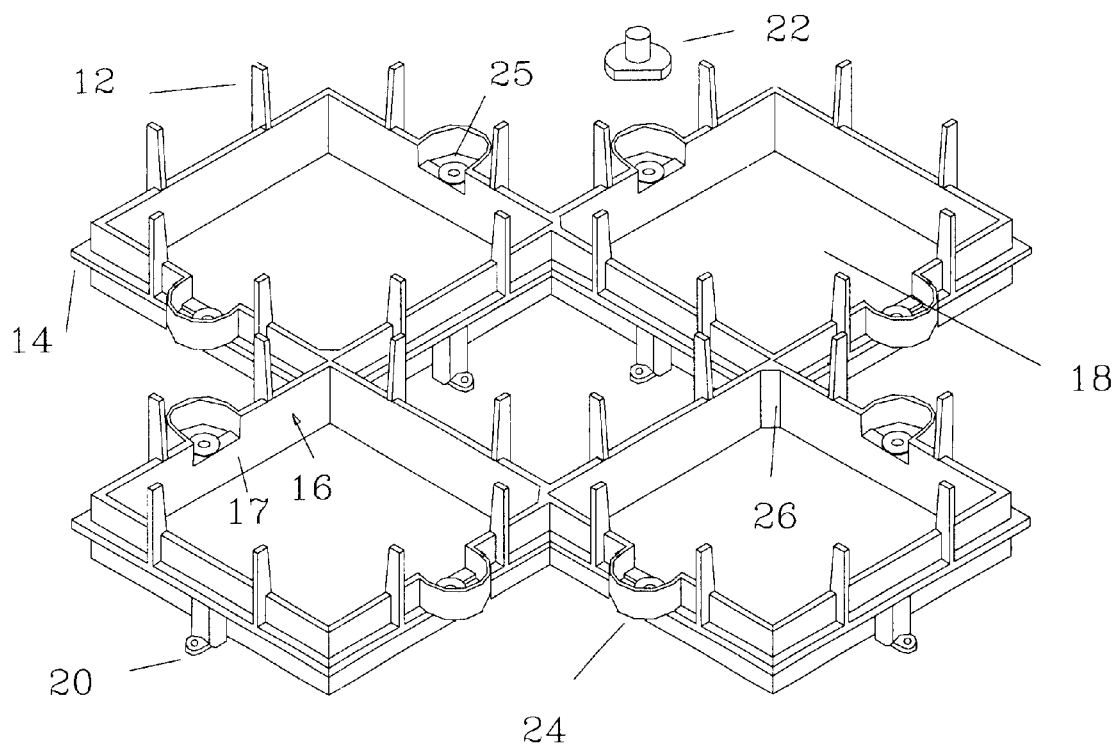
FIG. 1 is a perspective view of one embodiment of a land grid array multi-chip module holding member.
Figure 2:
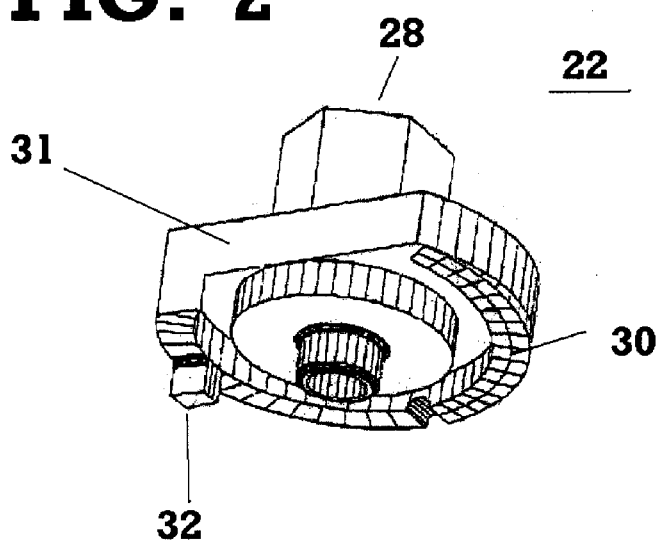
FIG. 2 is an enlarged perspective view of the retainer member of the embodiment of FIG. 1.
Figure 3:
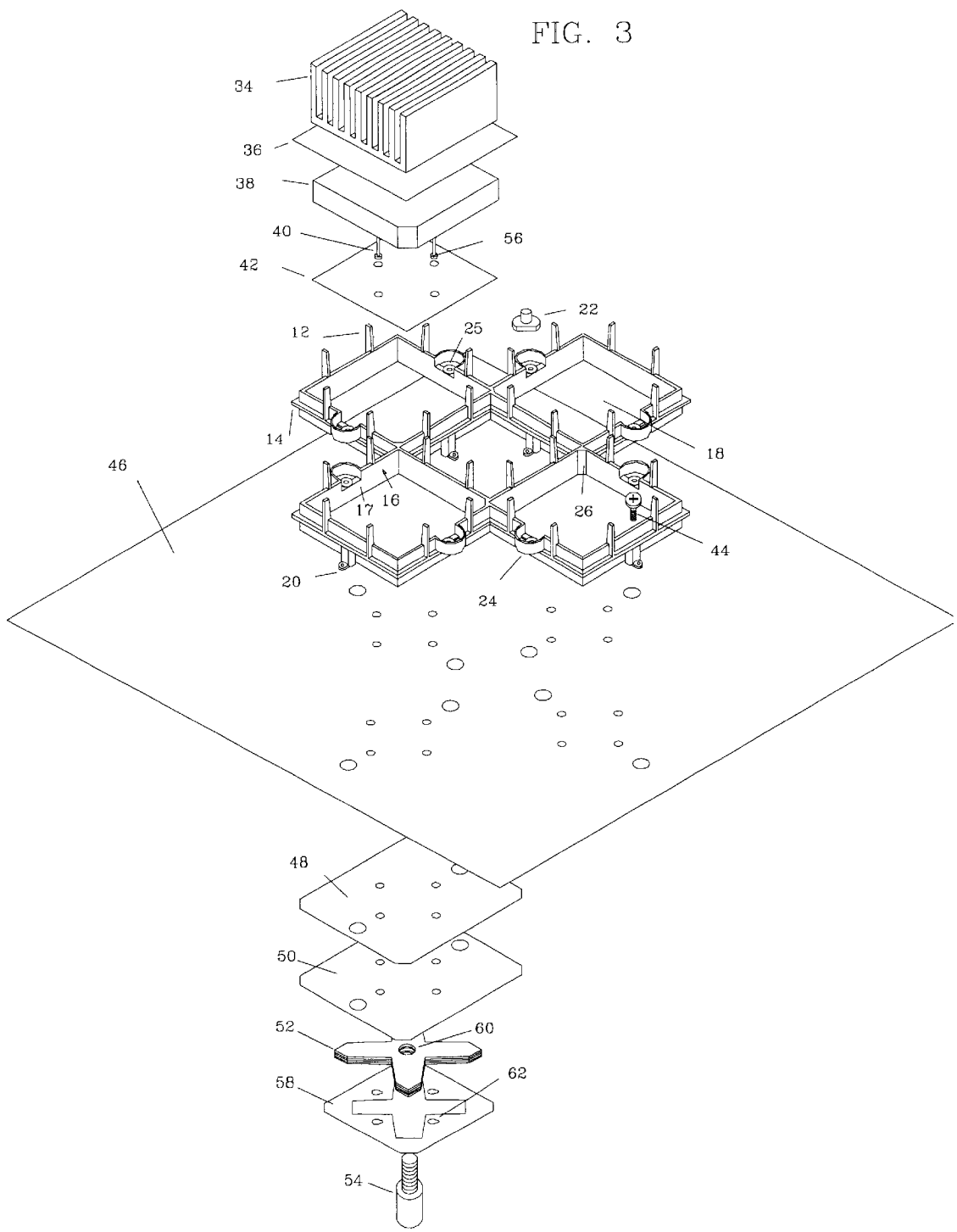
FIG. 3 is an exploded perspective view of one embodiment of a land grid array multi-chip module holding member, a multi-chip module assembly and related components.

One embodiment of the land grid array (LGA) multi-chip module holding member is illustrated in FIGS. 1, 2, and 3 designated in the aggregate as numeral 10. The module holding member may include a frame member 16 and at least one module retaining member 22 operably attached to the frame member 16 to allow retention of the module to the printed wiring board. The module holding member 10 may hold the module in position on one side of a printed wiring board or back plane, to allow an installer to move to the opposite side of the printed wiring board and actuate the module connection system.

The frame member 16 may provide structural support and electrical continuity for the components attached to the holding member. In one embodiment, the frame 16 may comprise four conductive walls 17 encircling four module LGA socket sites 18. The walls may include a stiffening rib 14 perpendicular to the wall 17 on the side opposite the module LGA socket site 18. Each wall 17 may support two retainer receptors 24 positioned on opposing sides of each module LGA socket site 18. In one embodiment, the retainer receptors 24 may include a cam stop channel 25. The stop channel 25 may be semicircular with a depth and width suitable for receiving the cam stop 32. In one embodiment, guide portions 12 extend from the frame 16 on each side of the module LGA socket site 18. The walls 17 may support two mounting pads 20 located on opposing sides of the module LGA socket site 18. The walls 17 may be joined together in a planer fashion with two corners of a wall 17 each contacting a corner of an adjacent wall.

Those skilled in the art will recognize that the number and location of the LGA socket sites, retainers, mounting pads, and guide members may vary while performing the same function. They will also recognize that the frame may be segmented with each segment supporting any number of retainers, mounting pads, and guide members. Segmenting the frame may result in reduced tooling costs and increased application flexibility.

Guide members or portions 12 may be attached to the frame 16 to assist in guiding the module into the LGA socket site 18. In one embodiment, two rectangular guide posts 12 are attached to the frame 16 extending outward from the frame 16 on the sides opposite the printed wiring board 46. In one embodiment, the guide posts 12 may be tapered outwardly from the frame 16 to facilitate placement of the module assembly in the LGA socket site 18. Those skilled in the art will recognize that the shape, size, and quantity of guide posts may vary greatly and still provide guidance.

A keying mechanism 26 may be included in the holding member 10 to assist in orientating the module. In one embodiment the keying mechanism 26 may include one chamfered corner of the four frame members 16 encircling a single LGA socket site 18. Mounting pads 20 may be structurally attached to the frame 16 to provide a means to attach the frame 16 to a printed wiring board 46. In one embodiment, two mounting pads 20 may be attached to the frame 16 on opposing sides of each module LGA socket site 18. The mounting pads 20 may be disk shaped with a hole to accept a fastener 44, including for example, a screw, or the like. Those skilled in the art will recognize that the number and position of mounting pads may change while fulfilling the intended purpose.

Module retaining members 22 may be operably attached to the frame 16 to allow installation and retention of a module 38. In one embodiment, the retaining member may be a cam 22 rotatably attached within a retaining receptor 24 on the frame 16 using a fastener. The cam 22 may be comprised of plastic material, which may be of a different color than the frame 16 to aid in visually identifying the cam. The cam 22 may include a hexagonal column 28 located at the center of the cam extending away from the frame 16 to aid in rotating the cam 22. The column 28 may be sized to allow for engagement of standard tools used to rotate hexagonal fasteners. The cam 22 may include an inclined plane 30 about its perimeter on the side of the cam 22 facing the frame 16. The inclined plane 30 may include a stop 32. When the cam 22 is installed into the receptor 24, the stop 32 may be confined in the stop channel 25 to prevent over rotation of the cam 22. Those skilled in the art will recognize that other methods of retaining a module in the socket may be used.

During installation of the LGA multi-chip module assembly, the module holding member 10 may be attached to a printed wiring board 46. A module 38 may be inserted and retained into the module holding member 10. In one embodiment, the holding member 10 may be fastened to a printed wiring board 46 with fasteners. For example, screws 44 may be installed through the holes in the mounting pads 20 extending through the printed wiring board 46 and insulator 48 to engage threads in a metallic backside stiffener 50.

A heat sink 34 may be attached to a module 38 with thermal interface material 36 between the two. A LGA interposer 42 may be attached to the electrical contact surface of the module 38 using retaining clips. The retaining cams 22 may be rotated so that the flat surface 31 is facing the LGA socket site 18 allowing the module 38 access to the LGA socket site 18. The module 38 with attached LGA interposer 42 and heat sink 34 may be inserted into a module LGA socket site 18 in the holding member 10. As the module 38 is inserted into the LGA socket site 18, it may first contact the guide members 12 aligning the module 38 and the LGA socket site 18. Further insertion of the module 38 may interfere with the keying mechanism 26 if the module 38 is not of a specific orientation.

After the module 38 is inserted into the LGA socket site 18, the retaining cams 22 may be rotated until the stop 32 contacts the end of the stop channel 25. Rotating the cam 22 may cause the inclined plane 30 on the cam 22 to contact the module 38. The process results in an applied force on the module 38 toward the printed wiring board 46. The resulting force on the module 38 may retain the module 38 and the LGA interposer 42 in position. The technician or installer may then physically release the module 38 and move to the opposite side of the printed wiring board 46.

The spring plate 52 may be attached to a load transfer plate 58 using retainer clips. The load transfer plate 58 may be installed by positioning the assembly adjacent to the stiffener 50 so that the load post 40 pass through keyhole slots 62 in the load transfer plate 58. The load transfer plate 58 may then be moved laterally until the slots 62 fully engage the shoulder 56 on the tip of each load post 40. An actuation screw 54 may then be installed in a threaded bushing 60 of the spring plate 52. Tightening the screw 54 may cause the screw 54 to contact the backside stiffener 50. Further tightening of the screw 54 can cause the spring plate 52 to be displaced away from the stiffener 50 creating a reactive load in the spring plate 52 that is transmitted to the load transfer plate 58. The load on the load transfer plate 58 may produce a tensile force within the load posts 40 pulling the module 38 toward the printed wiring board 46, compressing the LGA interposer 42, and establishing electrical signal connection between the module 38 and printed wiring board 46. The backside stiffener 50 may be attached to an enclosure, for example, a module cabinet, to provide electrical grounding.

In one embodiment, the holding member 10 may provide electrical conduction between attached components and ground. The heat sink 34 may be in contact with the module 38. The module 38 may be contacted by the inclined plane 30 on the retaining cams 22. The retaining cams 22 may be molded of an electrically conductive plastic. The retaining cams 22 may contact the retainer receptors 24 on the frame 16. The frame 16 may be attached to the cam receptors 24 and mounting pads 20. The frame 16, cam receptors 24, and mounting pads 20 may be molded of an electrically conductive material. The mounting pads 20 may be attached to a metallic backside stiffener 50 using metallic screws. The metallic backside stiffener 50 may be electrically connected to ground.

While the embodiments of the invention disclosed herein are presently considered to be preferred, various changes and modifications may be made without departing from the spirit and scope of the invention. The scope of the invention is indicated in the appended claims, and all changes that come within the meaning and range of equivalents are intended to be embraced therein.

What is claimed is:

1. An installation apparatus for mounting a land grid array (LGA) module having an upper and a lower surface thereof on a printed wiring board (PWB) having a front and a back surface thereof, the apparatus comprising:

a frame member surrounding an LGA socket site, the frame having a back side adapted for fixed attachment to the PWB and a front side adapted for receiving at least one module holding member; and at least one module holding member fixedly attached to the frame for retention therewith regardless of whether there is an LGA multi-chip module in the LGA socket site or not, and for rotation about an axis from a first to a second angular position of the module holding member with respect to the frame, the module holding member having a lower surface thereof defining an inclined plane adapted for contacting the upper surface of an LGA multi-chip module located in the LGA socket site;

the inclined plane of the module holding member exerting a progressively increasing clamping force against the upper surface the LGA multi-chip module for retaining the LGA multi-chip module in the LGA socket site of the frame member as the module holding member is rotated in one direction about the axis from the first to the second angular position of the module holding member, and exerting a progressively decreasing clamping force against the upper surface the LGA multi-chip module for releasing the LGA multi-chip module from the LGA socket site of the frame member as the module holding member is rotated in the other direction about the axis from the second to the first angular position of the module holding member.

2. The apparatus of claim 1 wherein the frame member comprises conductive plastic.

3. The apparatus of claim 1 wherein the frame member comprises a plurality of LGA socket sites to receive a plurality of LGA multi-chip module assemblies.

4. The apparatus of claim 1 wherein the frame member includes a chamfered corner to orientate the module assembly.

5. The apparatus of claim 1 wherein the at least one module holding member comprises a cam members rotatably attached to the frame.

6. The apparatus of claim 5 further comprising a cam receptors formed in the frame to receive each of the at least one the cam members.

7. The apparatus of claim 6 wherein the at least one cam member is rotatably attached to the cam receptors.

8. The apparatus of claim 5 wherein a hexagonal column is formed on the cam members to facilitate rotation.

9. The apparatus of claim 5 wherein a stop is formed on an inclined plane of the cam member to prevent over rotating the cam.

10. The apparatus of claim 1 further comprising at least one guide portion formed on the frame.

11. The apparatus of claim 1 wherein the frame further comprises at least one mounting pad adapted to receive a fastener for attaching the frame to the PWB.

12. The apparatus of claim 1 wherein a stiffening rib is formed in a wall of the frame adjacent the LGA socket site.

13. An installation apparatus for mounting a land grid array (LGA) multi-chip module having an upper and a lower surface thereof on a printed wiring board (PWB) having a front and a back surface thereof, the apparatus comprising:

module mounting means defining an LGA socket site, and adapted for fixed attachment to the PWB; and at least one module holding member fixedly attached to the module mounting means for retention therewith regardless of whether there is an LGA multi-chip module in the LGA socket site or not, and for rotation about an axis from a first to a second angular position of the module holding member;

the module holding member having a lower surface thereof defining an inclined plane adapted for contacting the upper surface of an LGA multi-chip module located in the LGA socket site;

the inclined plane of the module holding member exerting a progressively increasing clamping force against the upper surface of an LGA multi-chip module in the LGA socket site for retaining the LGA multi-chip module in the LGA socket site as the module holding member is rotated in one direction about the axis from the first to the second angular position of the module holding member, and exerting a progressively decreasing clamping force against the upper surface the LGA multi-chip module for releasing the LGA multi-chip module from the LGA socket site of the frame member as the module holding member is rotated in the other direction about the axis from the second to the first angular position of the module holding member.

* * * * *

UNITED STATES PATENT AND TRADEMARK OFFICE
CERTIFICATE OF CORRECTION

PATENT NO. : 6,634,095 B2
DATED : October 21, 2003
INVENTOR(S) : Colbert et al.

It is certified that error appears in the above-identified patent and that said Letters Patent is hereby corrected as shown below:

Column 6,
Line 13, replace the word "members" with the word -- member --
Line 17, replace the phrase "one the cam members" with the phrase -- one cam member --
Line 19, replace the word "receptors" with the word -- receptor --

Signed and Sealed this

Twenty-eighth Day of December, 2004

JON W. DUDAS
*Director of the United States Patent and Trademark Office*